United States Patent
Arnold et al.

(10) Patent No.: US 10,304,692 B1
(45) Date of Patent: May 28, 2019

(54) METHOD OF FORMING FIELD EFFECT TRANSISTOR (FET) CIRCUITS, AND FORMING INTEGRATED CIRCUIT (IC) CHIPS WITH THE FET CIRCUITS

(71) Applicant: International Business Machines Corporation, Armonk, NY (US)

(72) Inventors: John C. Arnold, Valatie, NY (US); Robert L. Bruce, White Plains, NY (US); Sebastian U. Engelmann, White Plains, NY (US); Nathan P. Marchack, New York, NY (US); Hiroyuki Miyazoe, White Plains, NY (US); Jeffrey C. Shearer, Albany, NY (US); Takefumi Suzuki, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/824,175

(22) Filed: Nov. 28, 2017

(51) Int. Cl.
*H01L 21/336* (2006.01)
*H01L 21/311* (2006.01)
*H01L 21/768* (2006.01)
*H01L 21/8234* (2006.01)

(52) U.S. Cl.
CPC .. *H01L 21/31116* (2013.01); *H01L 21/76897* (2013.01); *H01L 21/823425* (2013.01); *H01L 21/823475* (2013.01)

(58) Field of Classification Search
CPC ......... H01L 21/31116; H01L 21/76897; H01L 21/823475; H01L 21/823425
USPC ....................................................... 438/299
See application file for complete search history.

(56) References Cited

U.S. PATENT DOCUMENTS

| | | | |
|---|---|---|---|
| 5,866,485 | A | 2/1999 | Kirchhoff et al. |
| 5,965,036 | A | 10/1999 | Hung et al. |
| 6,174,451 | B1 | 1/2001 | Hung et al. |
| 6,183,655 | B1 | 2/2001 | Wang et al. |
| 6,337,285 | B1 | 1/2002 | Ko |

(Continued)

FOREIGN PATENT DOCUMENTS

EP 0651434 A2 5/1995

(Continued)

OTHER PUBLICATIONS

Rupp et al., "High yielding self-aligned contact process for a 0.150 □m mu/m DRAM technology", IEEE transactions on semiconductor manufacturing, 15(2), 223-228 (2002).

(Continued)

*Primary Examiner* — Anthony Ho
*Assistant Examiner* — Mohammad M Hoque
(74) *Attorney, Agent, or Firm* — Law Office of Charles W. Peterson, Jr.; Louis J. Percello, Esq.

(57) ABSTRACT

A method of forming field effect transistor (FET) circuits, and forming Integrated Circuit (IC) chips with the FET circuits. After forming gate sidewall spacers, filling with insulation and planarizing to the top of the sidewall spacers, self-aligned source/drain contacts are etched through the insulation and said gate dielectric layer to source/drain regions. A combination fluoroether/hydrofluoroether-hydrofluorocarbon (*FE-HFC) plasma etch etches the source/drain contacts self-aligned. The self-aligned contacts are filled with conductive material, and FETs are wired together into circuits, connecting to FETs through the self-aligned contacts.

20 Claims, 4 Drawing Sheets

(56) References Cited

U.S. PATENT DOCUMENTS

| | | | |
|---|---|---|---|
| 6,514,425 B1* | 2/2003 | Sekiya | H01L 21/3065 216/67 |
| 6,803,318 B1 | 10/2004 | Qiao et al. | |
| 2003/0042465 A1 | 3/2003 | Ko | |
| 2007/0148965 A1 | 6/2007 | Trapp | |
| 2014/0080308 A1 | 3/2014 | Chen et al. | |
| 2017/0040175 A1* | 2/2017 | Xu et al. | |
| 2017/0243756 A1* | 8/2017 | Matsuura | H01L 21/3065 |
| 2018/0047581 A1* | 2/2018 | Ito | G03F 7/0002 |
| 2018/0315614 A1* | 11/2018 | Posseme | H01L 21/823864 |

OTHER PUBLICATIONS

Kim et al., "Study on self-aligned contact oxide etching using C 5 F 8/O 2/Ar and C 5 F 8/O 2/Ar/CH 2 F 2 plasma", Journal of Vacuum Science & Technology A: Vacuum, Surfaces, and Films, 23(4), 953-958 (2005).

IP.com, "Selective Reactive Ion Etch for Silicon Oxide Over Silicon Nitride", IPCOM000037679D, Jan. 29, 2005.

Graf et al., "Highly selective oxide to nitride etch processes on BPSG/Nitride/Oxide structures in a MERIE Etcher", In IEEE Advanced Semiconductor Manufacturing Conference and Workshop, (IEEE/SEMI), pp. 314-319 (1998).

* cited by examiner

METHOD OF FORMING FIELD EFFECT TRANSISTOR (FET) CIRCUITS, AND FORMING INTEGRATED CIRCUIT (IC) CHIPS WITH THE FET CIRCUITS

BACKGROUND OF THE INVENTION

Field of the Invention

The present invention generally relates to Integrated Circuit (IC) manufacture and more particularly to manufacturing integrated circuits with self-aligned contacts to Field Effect Transistor (FET) source/drain regions.

Background Description

Primary integrated circuit (IC) chip manufacturing goals include increasing chip density and performance at minimized power consumption, i.e., packing more function operating at higher speeds in the same or smaller space. Transistors or devices are formed by stacking layers of shapes on the IC, e.g., printed layer by layer on a wafer using photolithographic techniques. A simple field effect transistor (FET), or device, includes a gate above a semiconductor channel, a dielectric gate sidewall spacer, e.g., nitride, over source/drain extensions at each end of the channel, and source/drain regions outboard of the gate sidewall spacers. In arrays, for example, two or more devices share source/drain regions with shared source/drain contacts, to realize significant space savings. The gate sidewall spacers both insulate the gate from adjacent source/drain contacts, and define the channel extensions that mitigate short channel effects. Shrinking/reducing chip layer thicknesses and feature sizes to increase density and performance provides a corresponding reduction in minimum device dimensions and spacing.

Typically, source/drain contacts are formed through a second insulation, e.g., silicon oxide, different from the sidewall spacers (nitride) that fills above the source/drain regions and between adjacent gates. Using a plasma etch in a fluorocarbon (FC) or hydrofluorocarbon (HFC) gas plasma, for example, to etch silicon oxide selective to silicon nitride primarily etches the oxide to open contacts to source/drain that are self-aligned to the gate. Thus, self-aligned contacts minimize tolerance spacing normally required for aligning shapes in an FET that are formed on different levels or steps, and sometimes several different levels. Thus, in ICs with large numbers of shared source/drain contacts, such as memory arrays, self-aligned contacts provide a significant space reduction. However, as device features shrink, sidewall spacers have to shrink too, and unfortunately, previously negligible effect are becoming problematic.

Thinner sidewall spacers are subject to physical and chemical effects that were both previously negligible at previously larger dimensions using a state of the art HFC plasma etch. Physical effects from the HFC plasma may shorten thin sidewall spacers to expose the upper edges of the adjacent gate. The exposed edge(s) make the gate vulnerable to shorts, for example, to source/drain contacts. Chemical effects of the etchants tend to thin the sidewall spacers even further. Thinner sidewall spacers result in source/drain extensions that are shorter than intended, changing device characteristics and further exposing the gate to shorts. Consequently, these unintended physical and chemical effects can dramatically lower yield.

Thus, there is a need for minimizing yield loss from FET gate defects; and more particularly, there is a need for forming self-aligned contacts to maximize device density while maintaining FET gate sidewall integrity to minimize FET gate defects yield loss from defects arising from self-aligned contacts.

SUMMARY OF THE INVENTION

In an aspect of the invention self-aligned contacts are formed without loss of device sidewall thickness;

In another aspect of the invention self-aligned contacts are formed without loss of device sidewall height;

In yet another aspect of the invention source/drain regions self-aligned contacts are etched with high selectivity, stopping on the semiconductor surface at the bottom of the contact even without a etch stop on the surface;

In yet another aspect of the invention source/drain regions self-aligned contacts are etched with high selectivity without loss of device sidewall thickness or height, and stopping on the semiconductor surface at the bottom of the contact even without a etch stop on the surface;

The present invention relates to a method of forming field effect transistor (FET) circuits, and forming Integrated Circuit (IC) chips with the FET circuits. After forming gate sidewall spacers, filling with insulation and planarizing to the top of the sidewall spacers, self-aligned source/drain contacts are etched through the insulation and said gate dielectric layer to source/drain regions. A combination fluoroether/hydrofluoroether-hydrofluorocarbon plasma etch etches the source/drain contacts self-aligned. The self-aligned contacts are filled with conductive material, and FETs are wired together into circuits, connecting to FETs through the self-aligned contacts.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
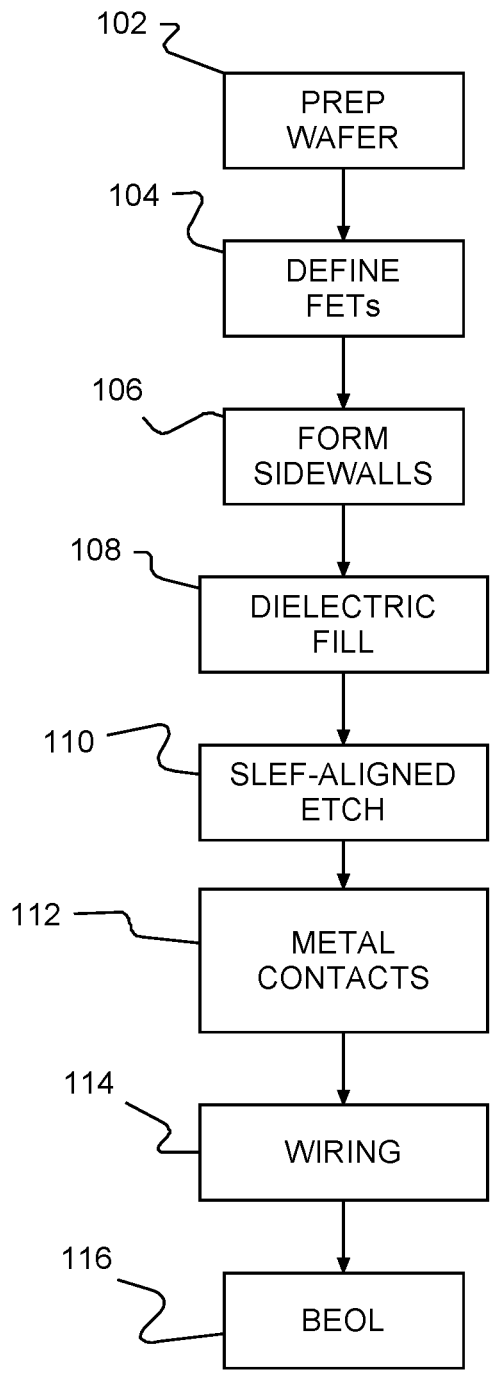
FIG. 1 shows an example of a method of forming self-aligned contacts at high density, narrow-pitch semiconductor devices according to a preferred embodiment of the present invention.

Turning now to the drawings and, more particularly, FIG. 1 shows an example of a method 100 of forming self-aligned contacts at high density, narrow-pitch semiconductor devices, e.g., array Field Effect Transistors (FETs), FET circuits and integrated circuit (IC) chips with preferred FET circuits, according to a preferred embodiment of the present invention. The inventors have discovered that hydrofluorocarbon (HFC) in combination with fluoroether (FE) or hydrofluoroether (HFE) and an inert gas in an FE-HFC or HFE-HFC (hereinafter *FE-HFC) plasma etch, and preferably, a FE-HFC plasma etch, provides a highly selective plasma etch for etching silicon oxide selective to silicon nitride.

Thus, a preferred *FE-HFC plasma etch provides for etching self-aligned source/drain contacts to a semiconductor source/drain surface without appreciable degradation of adjacent silicon nitride gate sidewall spacers, i.e., minimum sidewall spacer loss. The preferred *FE-HFC plasma etch also avoids the occurrence of an "etch stop." An etch stop can occur when too much incidental polymer forms during etching. That incidental polymer inhibits any further etching.

Although described herein for application to a simple polysilicon gate on oxide FET technology, this is for example only. The present invention has application wherever self-aligned contacts are formed to FETs, regardless of the particular FET technology, regardless of whether metal or semiconductor and gate, regardless of whether the gate dielectric is oxide, a hi-k dielectric or some other suitable dielectric. Further, the present invention has application to forming self-aligned contacts to FETs on semiconductor bulk, or semiconductor or silicon on insulator (SOI), wafers. The semiconductor may be silicon, germanium (Ge), a III-V semiconductor or compound thereof.

Chip fabrication begins in step 102 by preparing a semiconductor wafer. In step 104 FET gates are defined on the wafer. Sidewall spacers are formed 106 along the gates. An insulating layer of dielectric is formed 108 on the wafer insulating adjacent gates, and any additional device fabrication continues to define devices prior to contact formation, e.g., replacing dummy gates with metal. In step 110 self-aligned contacts are etched in a *FE-HFC plasma etch. Metal fills 112 the self-aligned contacts, e.g., in a metal deposition and chemical-mechanical polish (CMP). A wiring level is formed 114 on the wafer, contacting the self-aligned contacts and gates. Thereafter, in step 116 chip processing continues through the Back End Of the Line (BEOL) to complete chip definition.

Figure 2:
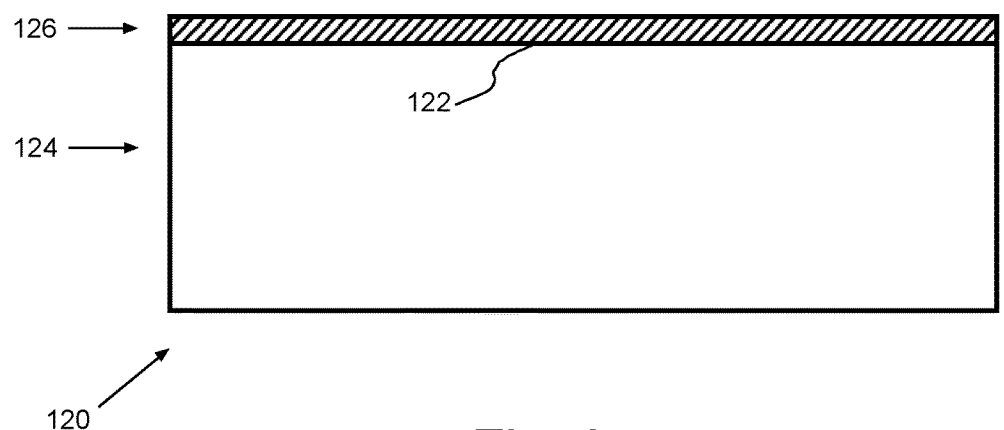
FIG. 2 shows a cross-sectional example of a prepped semiconductor wafer after forming a gate dielectric layer.

FIG. 2 shows a cross-sectional example of a semiconductor wafer 120 at the surface 122 prepared in step 102 of FIG. 1. For a bulk wafer 120 device formation begins on the wafer surface 122. For an SOI wafer 120 the surface 122 is on a surface layer 124 above insulator (not shown) in the SOI wafer 120. P-type and N-type regions are defined in the surface 122, e.g., with trench isolation (not shown), and each type region is doped with appropriate channel doping for forming NFET and PFET channels on the respective regions. A gate oxide layer 126 is formed on the surface 122.

Figure 3:
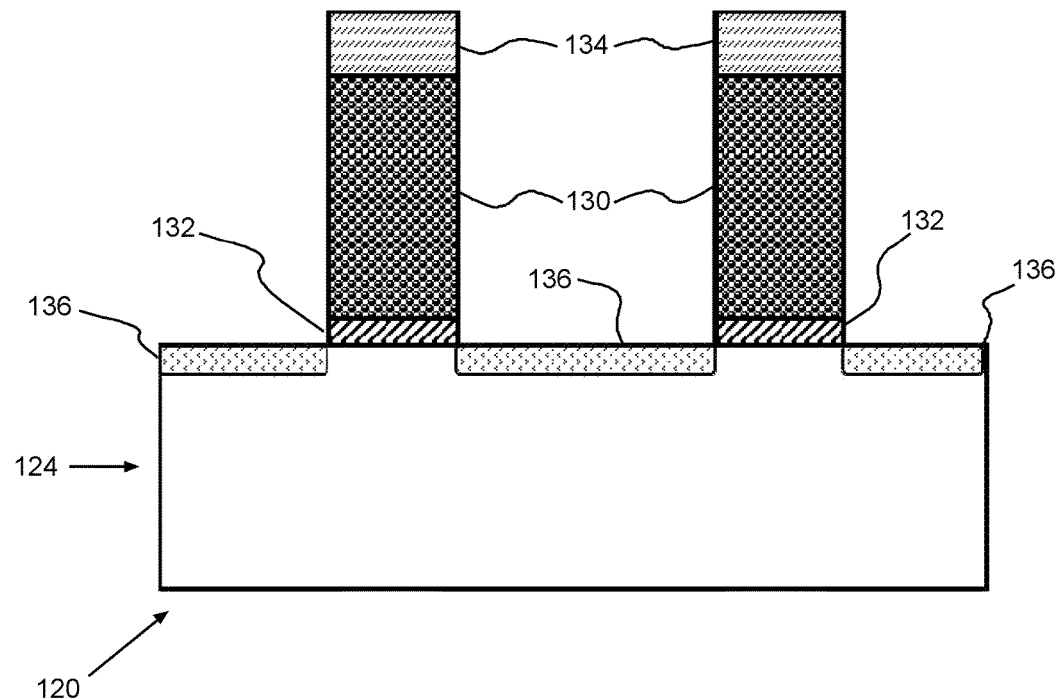
FIG. 3 shows an example of device gates formed on gate oxide.

As shown in the example of FIG. 3 devices (step 104 in FIG. 1) are defined by forming device gates 130 on the gate oxide 132 on semiconductor wafer 120 of FIG. 2 with like features labeled identically. A 5-100 nm, preferably, 50 nm thick gate layer, e.g., polysilicon, is formed on gate oxide layer 126. In this example, a 20-100 nm, preferably, 30 nm thick layer of mask material, preferably silicon nitride, is formed on the gate layer. A hard mask 134 is patterned from the mask layer, e.g., photolithographically. Etching the gate layer and gate oxide layer 126 after forming hard mask 134 define gates 130 on gate oxide 132. The semiconductor surface between the gates 130 may be lightly doped 136 with an extension implant.

Figure 4:
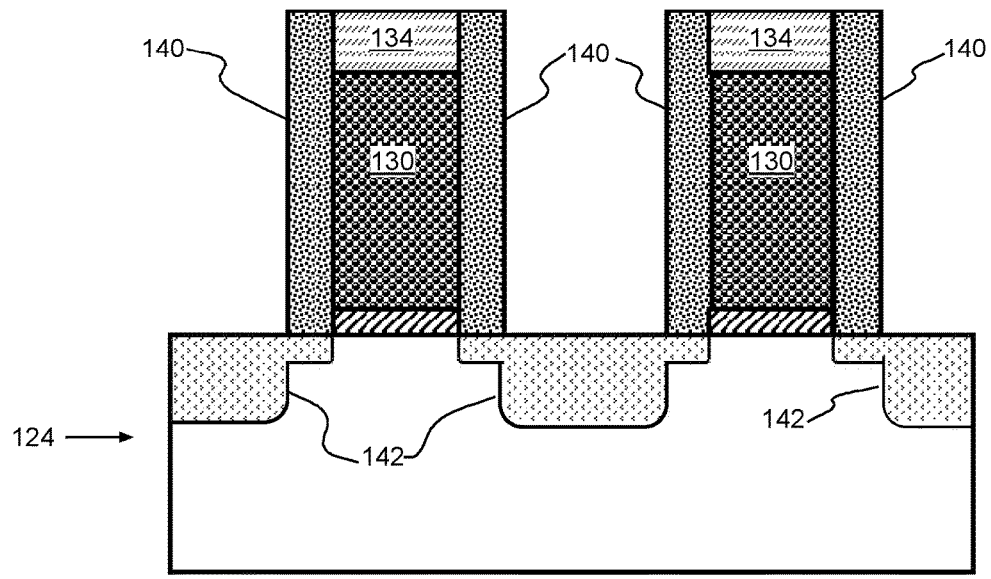
FIG. 4 shows an example of gate sidewall spacers formed alongside the gates.

As shown in the example of FIG. 4 gate sidewall spacers 140 are formed 106 alongside the gates 130 of FIG. 3 with like features labeled identically, and defining source/drain areas 142. A 2-50 nm, preferably, a 10 nm thick conformal layer of dielectric, e.g., silicon nitride, is formed on the wafer and above the mask 134 and gates 130. An anisotropic etch, e.g., a Reactive Ion Etch (RIE), removes horizontal portions of the dielectric layer, e.g., above the mask layer 130 and at source/drain areas 142 After the anisotropic, etch gate sidewall spacers 140 remain alongside the gates 130 and above where source/drain extensions may be formed, e.g., along with a halo implant. The space between the sidewall spacers 140 defines a shared source/drain. Typical dope and diffusion steps form shared source/drain diffusion regions 142, doped with the appropriate dopant type, i.e., P-doped for P-type and N-doped for N-type.

Figure 5:
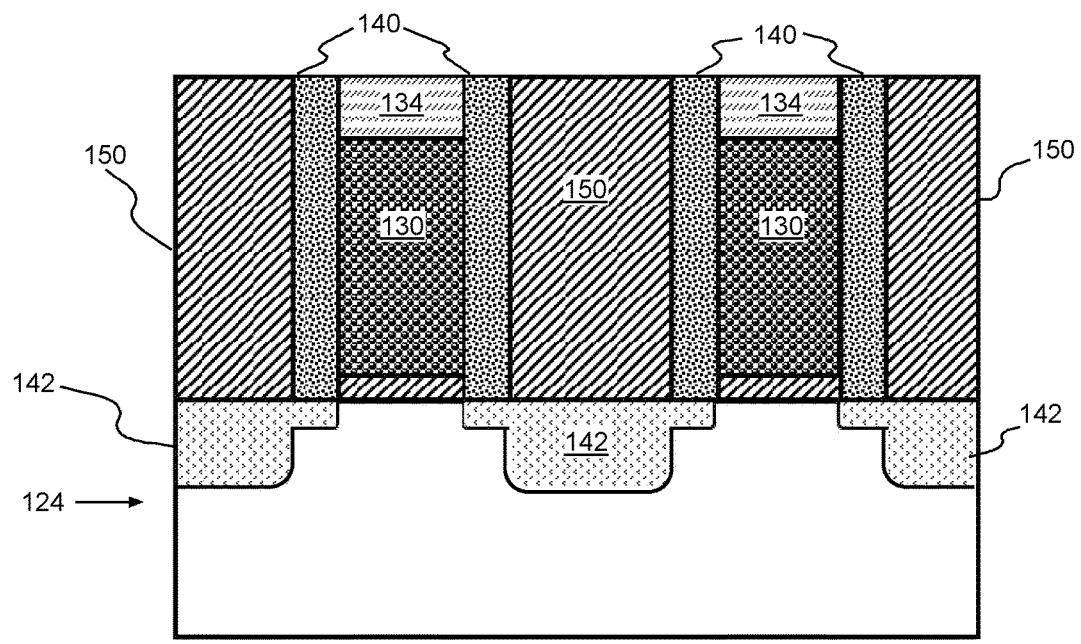
FIG. 5 shows an example of insulation material filling areas between gates.

As shown in the example of FIG. 5, an insulation material layer 150, e.g., oxide, formed on the wafer 120 fills areas above source/drain regions 142 between gates 130. For example, oxide may be deposited on the wafer 120 and planarized using CMP to, and re-exposing, the hard mask 134. Although shown as separate layers in this example, insulation material 150 may be the same material as gate oxide 132, forming a uniform layer to the source/drain diffusions 142.

As noted hereinabove, for convenience of description the present invention is described for semiconductor gates. At this point, however, for a replacement metal gate FET (RMGFET) technology the previously formed gates 130 are temporary and of a temporary material, e.g., semiconductor. After forming the insulation material 150 in an RMGFET technology, hard mask 134 and gates 130 are removed and replaced with metal prior to proceeding.

Figure 6:
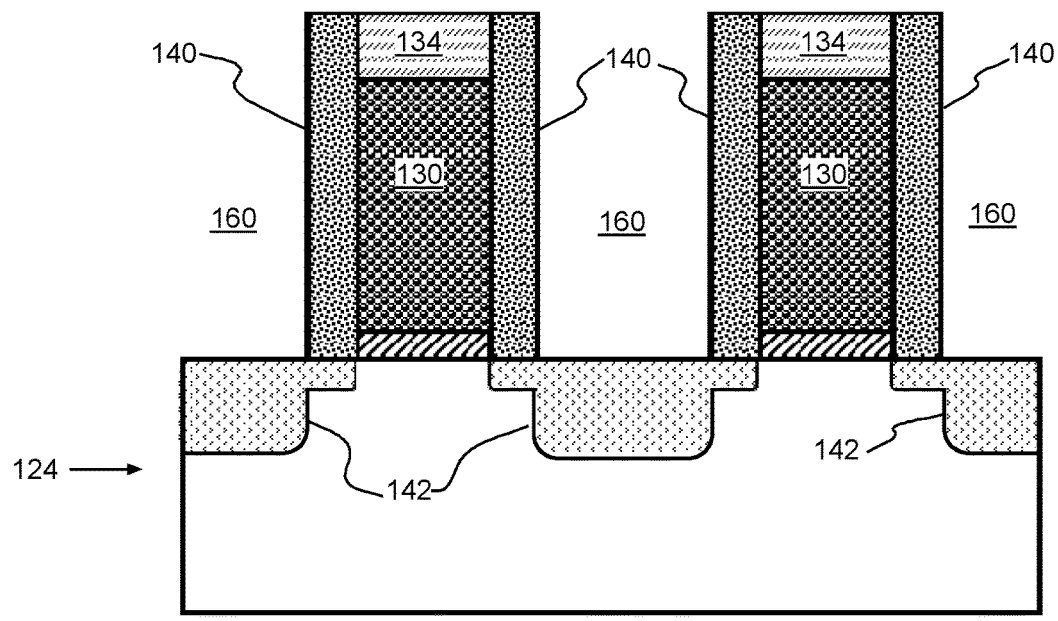
FIG. 6 shows an example of *FE-HFC plasma-etched, self-aligned contacts opened through the insulation material.

In the example of FIG. 6, a preferred *FE-HFC plasma etch 110 opens self-aligned contacts through insulation material 150. A mask (not shown) is formed on the wafer in a typical photolithographic masking step, exposing insulation material 150, and defining contact openings 160 at source/drain contact locations, e.g., 10-100 nm square contacts. A preferred *FE-HFC plasma etch etches only the exposed insulation material 150.

Preferably, the hydrofluorocarbon gas is 1.5%±0.75% and the fluoroether or hydrofluoroether gas is 4%±2% of the combined plasma gas with the inert gas being at least 90%. Preferably, the inert gas is argon and helium, and when exited in a plasma etch chamber, creates a high-density plasma. Preferably, a radio frequency (RF) power source inductively couples power into the chamber with the substrate being etched supported on a pedestal. The pedestal is also biased by an RF power source at a higher power than the inductively coupled power. Also, a silicon containing surface may be included in the chamber and maintained at least at 20° C. to scavenge fluorine from the plasma. As a result, the etch exhibits a high selectivity to silicon oxide over silicon nitride. Because of the high selectivity of the preferred *FE-HFC plasma etch, the sidewall spacers 140 remain unetched, and etching stops on the source/drain diffusions 142 without eroding it and without an etch stop forming. Thus, the preferred *FE-HFC plasma etch opens self-aligned contacts to the source/drain diffusions 142 without degrading surrounding device structures.

Preferably, the *FE-HFC is $C_5HF_7$ in combination with $C_5F_{10}O$. The *FE gas minimizes gate sidewall spacer 140 loss at a preferred flow rate below 30 standard cubic centimeters per minute (sccm), preferably 24 sccm.

Figure 7:
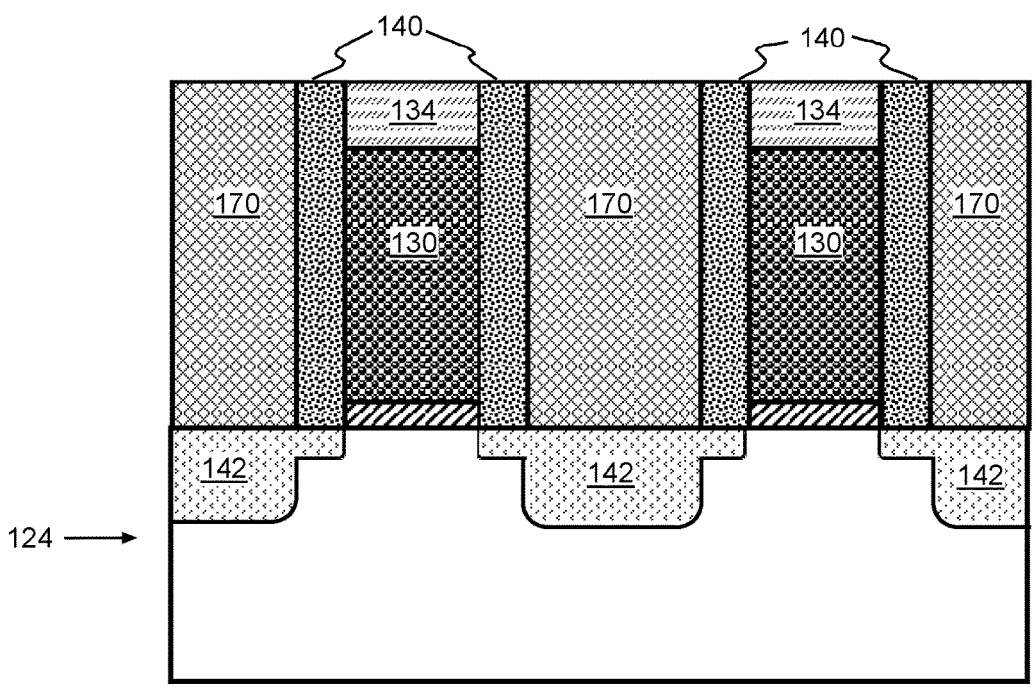
FIG. 7 shows an example of a completed self-aligned contact filled with a conductive material.

The example of FIG. 7 shows completed self-aligned contacts 170 after filling 112 the contact openings 160 of FIG. 5 with a suitable conductive material, e.g., metal. Metal, preferably, tungsten is deposited on the wafer 120, e.g., using chemical vapor deposition (CVD). Then, using a CMP the wafer is planarized removing excess metal from the surface, such that metal only remains in self-aligned contacts 170. Circuit definition continues normally, forming wiring on and above the planarized surface and to the self-aligned contacts 170. The wiring connects devices together into circuits and circuits together on the chips. BEOL fabrication complete the chip 120, e.g., connecting the circuits to pads and terminal metallurgy.

Thus advantageously, the preferred plasma etch forms self-aligned contacts to densely packed, FET source/drain regions with high selectivity. The high selectivity minimizes spacer loss and eliminates unwanted etch stop formation. Thus, the present invention simplifies chip fabrication, reduces cost and improves yield, especially in high density, small pitch FET applications.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming field effect transistor (FET) circuits, said method comprising:
    forming a gate dielectric layer on a semiconductor surface;
    forming gates on said a gate dielectric layer;
    forming gate sidewall spacers alongside each gate, said gate sidewall spacers being formed of a second dielectric;
    forming source/drain region adjacent to said each gate sidewall;
    forming an insulation layer on said semiconductor surface, said insulation layer filling between said gate sidewall spacers;
    etching source/drain contacts through said insulation layer with a combination fluoroether/hydrofluoroether-hydrofluorocarbon (*FE-HFC) plasma etch, etched said source/drain contacts being self-aligned to said source/drain regions;
    filling the self-aligned contacts with conductive material; and
    forming wires connected to said self-aligned contacts, said wires connecting FETs into circuits.

2. A method of forming FET circuits as in claim 1, wherein *FE gas flow in said combination *FE-HFC plasma etch is at a flow rate at or below 30 standard cubic centimeters per minute (sccm).

3. A method of forming FET circuits as in claim 2, wherein said *FE gas flow rate is 24 sccm.

4. A method of forming FET circuits as in claim 1, wherein etching source/drain contacts is at least at twenty degrees centigrade (20° C.).

5. A method of forming FET circuits as in claim 1, wherein said *FE-HFC is $C_5HF_7$ in combination with $C_5F_{10}O$.

6. A method of forming FET circuits as in claim 1, wherein said combination *FE-HFC gas is in a gas mixture that is at least 90% inert gas.

7. A method of forming FET circuits as in claim 1, wherein said insulation layer and said gate dielectric layer are the same material and different from said second dielectric.

8. A method of forming FET circuits as in claim 1, wherein the height and thickness of said gate sidewall spacers is unchanged by etching source/drain contacts.

9. A method of forming FET circuits as in claim 1, wherein said combination *FE-HFC plasma etch is in a plasma chamber, *FE-HFC being excited by a first radio frequency (RF) power inductively coupled into said chamber, and said semiconductor surface being on a semiconductor supported on a pedestal biased with a second RF power.

10. A method of forming FET circuits as in claim 9, wherein said second RF power is greater than said first RF power.

11. A method of forming an Integrated Circuit (IC) chip with a plurality of field effect transistor (FET) circuits, said method comprising:
    forming a gate dielectric layer on a semiconductor surface of a wafer;
    forming a plurality of gates on said a gate dielectric layer;
    forming gate sidewall spacers alongside each gate, said gate sidewall spacers being formed of a second dielectric;
    forming source/drain region adjacent to said each gate sidewall;
    forming an insulation layer on said wafer, said insulation layer filling between said gate sidewall spacers;
    etching self-aligned source/drain contacts at a plurality of locations with a combination fluoroether/hydrofluoroether-hydrofluorocarbon (*FE-HFC) plasma etch, etched said source/drain contacts being through said insulation layer and said gate dielectric layer to said source/drain regions;
    filling the self-aligned contacts with conductive material, a contact to a respective source/drain region being formed; and
    forming a plurality of wiring layers, wires in said plurality of wiring layers connecting FETs into circuits to and through said self-aligned contacts.

12. A method of forming an IC chip as in claim 11, wherein *FE gas flow in said combination *FE-HFC plasma etch is at a flow rate at or below 30 standard cubic centimeters per minute (sccm).

13. A method of forming an IC chip as in claim 12, wherein said *FE gas flow rate is 24 sccm.

14. A method of forming an IC chip as in claim 11, wherein etching source/drain contacts is at least at twenty degrees centigrade (20° C.).

15. A method of forming an IC chip as in claim 11, wherein said *FE-HFC is $C_5HF_7$ in combination with $C_5F_{10}O$.

16. A method of forming an IC chip as in claim 11, wherein said combination *FE-HFC gas is in a gas mixture that is at least 90% inert gas.

17. A method of forming an IC chip as in claim 11, wherein said insulation layer and said gate dielectric layer are the same material and different from said second dielectric.

18. A method of forming an IC chip as in claim 11, wherein the height and thickness of said gate sidewall spacers is unchanged by etching source/drain contacts.

19. A method of forming an IC chip as in claim 11, wherein said combination *FE-HFC plasma etch is in a plasma chamber, *FE-HFC being excited by a first radio frequency (RF) power inductively coupled into said chamber, and said semiconductor surface being on a semiconductor supported on a pedestal biased with a second RF power.

20. A method of forming an IC chip as in claim 19, wherein said second RF power is greater than said first RF power.

* * * * *